United States Patent [19]
Chang et al.

[11] Patent Number: 5,955,200
[45] Date of Patent: Sep. 21, 1999

[54] STRUCTURE FOR REDUCING STRESS BETWEEN METALLIC LAYER AND SPIN-ON-GLASS LAYER

[75] Inventors: Kow-Ming Chang, Hsinchu; Shih-Wei Wang, Pingtung, both of Taiwan

[73] Assignee: United Microelectronics Corp., Hsinchu, Taiwan

[21] Appl. No.: 09/020,946

[22] Filed: Feb. 9, 1998

[30] Foreign Application Priority Data

Nov. 18, 1997 [TW] Taiwan ................................. 86117165

[51] Int. Cl.[6] ............................................. B32B 17/00
[52] U.S. Cl. .......................... 428/426; 428/432; 428/469; 428/472
[58] Field of Search ..................... 428/426, 432, 428/469, 472, 701, 702

[56] References Cited

U.S. PATENT DOCUMENTS 5,419,988  5/1995  Mohri ............................................ 430/5

Primary Examiner—Timothy Speer
Attorney, Agent, or Firm—Snider & Chao LLP; Fei-Fei Chao

[57] ABSTRACT

A structure for reducing the stress between a HSQ dielectric layer and a metal layer. The structure comprises a metal layer, a stress buffer above the metal layer, and a spin-on-glass layer above the stress buffer. If the spin-on-glass layer is a dielectric material capable of producing tensile stress, the stress buffer layer is made from a material capable of generating compressive stress. On the contrary, if the spin-on-glass layer is a dielectric material capable of producing compressive stress, the stress buffer layer is made from a material capable of generating tensile stress.

12 Claims, 2 Drawing Sheets

STRUCTURE FOR REDUCING STRESS BETWEEN METALLIC LAYER AND SPIN-ON-GLASS LAYER

CROSS-REFERENCE TO RELATED APPLICATION

This application claims the priority benefit of Taiwan application serial no. 86117165, filed Nov. 18, 1997, the full disclosure of which is incorporated herein by reference.

BACKGROUND OF THE INVENTION

1. Field of Invention

The present invention relates to a structure for manufacturing a semiconductor device. More particularly, the present invention relates to a structure for reducing stress between a metallic layer and a spin-on-glass layer.

2. Description of Related Art

As the level of integration for semiconductor devices increase, there will be insufficient room on the surface to provide the necessary interconnects. To match the increase in interconnects necessary for connecting the increase number of metal oxide semiconductor (MOS) transistors after miniaturization, designs having two or more metallic interconnect layers are quite common.

Between two metallic layers, there must be an inter-metal dielectric layer for isolating and blocking the formation of unnecessary electrical circuits. Therefore, properties of the inter-metal dielectric layer are very important. In another aspect, the inter-metal dielectric layer is important because the ease and quality of subsequently deposited metallic layer, subsequent etching processes and resolution in a photolithographic process all depend on the degree of planarization of this layer.

Conventional method of isolating two metal layers includes using material such as tetra-ethyl-ortho-silicate (TEOS). However, the TEOS involves reaction at a rather high temperature of about 650° C. to 750° C. In addition, the degree of planarization of the deposited material is poor, and so a planarization operation such as a chemical-mechanical polishing (CMP) must be performed. Hence, in recent years, hydrogen silsesquioxane (HSQ) is gradually replacing TEOS as the material for forming inter-metal dielectric layers.

HSQ is a type of spin-on-glass (SOG) material that is extensively used the fabrication of semiconductor structures. HSQ is a suitable material for forming inter-metal dielectric layers because of its special properties. Properties of HSQ include a low dielectric constant, free from carbon and reflowable. Consequently, there is no need to perform etchback operations, which have a high risk of contamination, when using HSQ. Furthermore, since the HSQ has a good gap filling capability, processing steps can be reduced and production cost can be saved. In another aspect, the Si—H bonds formed inside a HSQ layer can prevent the absorption of moisture. Therefore, using the HSQ to perform direct-on-metal and non-etchback operation is capable not only of good planarization, but also able to obtain a low parasitic capacitance. Moreover, no chemical-mechanical polishing operations are necessary, and so some cost is saved.

FIGS. 1A and 1B are cross-sectional views showing the progression of steps in a conventional planarization process using HSQ in a direct-on-metal and non-etchback approach. In FIG. 1A, MOS devices and silicon substrate 10 below a metallic layer 12 are not drawn. First, as shown in FIG. 1A a dielectric material such as HSQ is mixed and then dissolved in a solvent to form a liquid state dielectric source solution. Thereafter, the dielectric solution is spin-coated onto the silicon substrate 10 to form an inter-metal dielectric layer 16. Due to the reflowability of HSQ, the spin-coated HSQ layer has a good gap filling capability.

Next, as shown in FIG. 1B, since the spin-coated HSQ dielectric layer 16 has solvent in it and the surface of the HSQ dielectric layer 16 is rather uneven, hence, heat flowing and curing operations need to be performed. First, as a preliminary step, a hot baking process is performed using, for example, a hot plate, at a temperature of about 150° C. for about 8 to 12 minutes. In the process, most of the solvent in the HSQ dielectric layer 16 is driven out and Si—O bond forming is initiated.

Thereafter, the temperature is raised to about 200° C. for a period of about 18 to 22 minutes for melting the dielectric layer 16. Subsequently, the temperature is raised to about 350° C. for another 18 to 22 minutes to start the heat flow operation. Hence, the degree of planarity of the HSQ dielectric layer 16 is increased and the effect of an undulating metallic layer 12 on the HSQ dielectric layer 16 is minimized. Finally, the temperature is raised to about 400° C. for about 18 to 22 minutes. At a high temperature, the residual solvent is driven away accompanied by the densification of the HSQ dielectric layer 16, and finally the layer is cured into a $SiO_2$-like structure.

However, due to the considerable volume contraction during the hot baking, heat flow and curing processes, high tensile stress will build up between the deposited spin-on-glass HSQ layer 16 and the underlying metallic layers 12. Furthermore, spin-on-glass structure has a weaker bonding strength compared with an oxide layer formed by a chemical vapor deposition method and a smaller coefficient of expansion compared with metal. Therefore, cracks are easily formed in the dielectric layer 16 due to subsequent thermal cycling.

In light of the foregoing, there is a need to provide a better method for forming the HSQ dielectric layer in order to reduce the internal tensile stress.

SUMMARY OF THE INVENTION

Accordingly, the present invention is to provide a structure for reducing the stress that exists between a spin-on-glass HSQ layer and a metallic layer such that cracks in the HSQ layer are reduced and device quality is improved.

To achieve these and other advantages and in accordance with the purpose of the invention, as embodied and broadly described herein, the invention provides a structure for reducing the stress that exists between a spin-on-glass HSQ layer and a metallic layer.

In details, this invention provides a structure for reducing the stress between a HSQ dielectric layer and a metal layer. The structure comprises a metal layer, a stress buffer above the metal layer, and a spin-on-glass layer above the stress buffer.

According to one preferred embodiment of this invention, a spin-on-glass layer is capable of producing tensile stress. Therefore, the stress buffer should be a dielectric layer capable of generating compressive stress to counteract the tensile stress in the spin-on-glass layer. Dielectric layer that can generate compressive stress includes an oxide layer formed by an electron cyclotron resonance (ECR) process. The ECR oxide layer is formed under the conditions of: using $SiH_4/O_2$ in a ratio of about 8/85 standard cubic centimeter per minute (sccm), deposition pressure of about 3 mTorr, microwave power input of about 350 Watts, and reacting temperature in the range 25° C. to 300° C.

A spin-on-glass layer that is capable of producing tensile stress includes a HSQ dielectric layer. The HSQ dielectric layer is formed in a four-stage process including a preliminary stage for evaporating the solvent, a second stage of melting the dielectric layer, a third stage of heat flowing and a fourth stage of curing. The preliminary stage of evaporating the solvent includes heating the dielectric layer in a hot plate to a temperature of about 150° C. for about 8 to 12 minutes; the second stage of melting the dielectric layer includes heating in a hot plate to a temperature of about 200° C. for about 18 to 22 minutes; the third stage of heat flow includes heating in a hot plate to a temperature of about 350° C. for about 18 to 22 minutes; and the fourth stage of curing includes heating in a hot plate to a temperature of about 400° C. for about 18 to 22 minutes.

If the spin-on-glass layer is made from a material capable of producing compressive stress, then the stress buffer should be made from a material that is capable of generating tensile stress.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
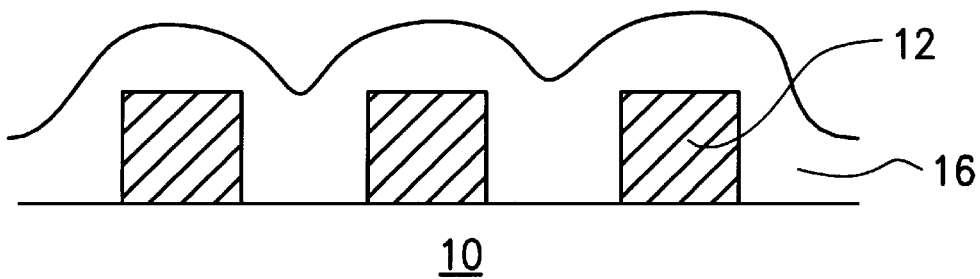
FIGS. 1A and 1B are cross-sectional views showing the progression of steps in a conventional planarization process using HSQ in a direct-on-metal and non-etchback approach.
Figure 1B:
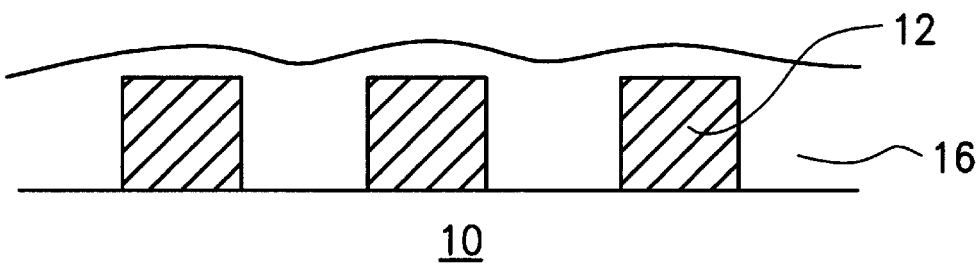

Reference will now be made in detail to the present preferred embodiments of the invention, examples of which are illustrated in the accompanying drawings. Wherever possible, the same reference numbers are used in the drawings and the description to refer to the same or like parts.

Figure 2A:
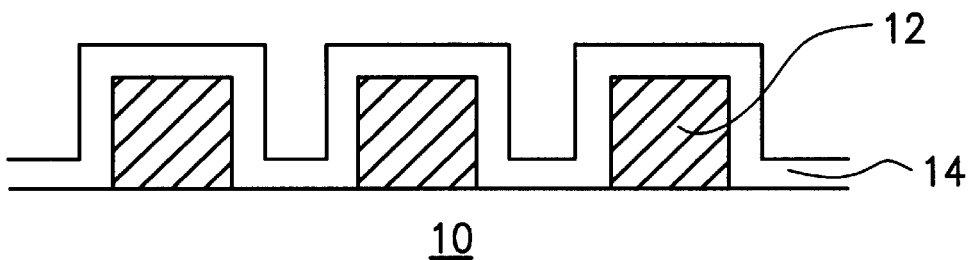
FIGS. 2A through 2C are cross-sectional views showing the progression of manufacturing steps in producing and planarizing a spin-on-glass HSQ layer having a reduced stress between the HSQ layer and a metal layer according to one preferred embodiment of this invention.
Figure 2B:
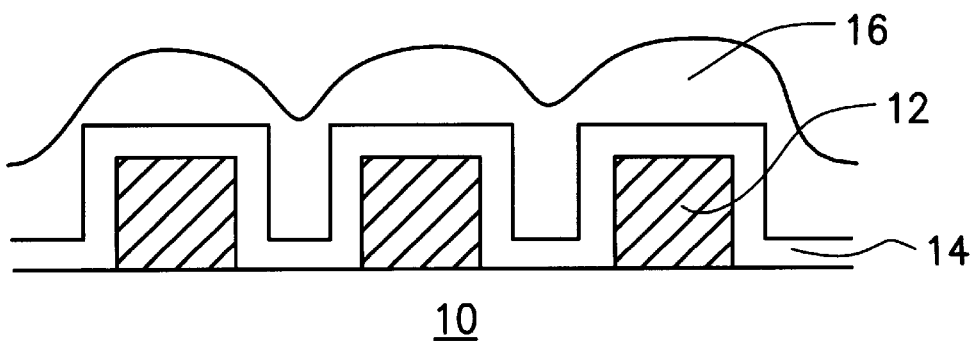
Figure 2C:
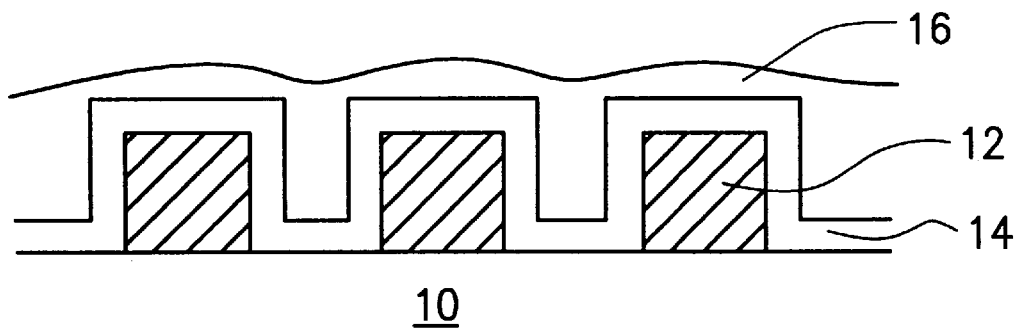

FIGS. 2A through 2C are cross-sectional views showing the progression of manufacturing steps in producing and planarizing a spin-on-glass HSQ layer having a reduced stress between the HSQ layer and a metal layer according to one preferred embodiment of this invention. In this embodiment of the invention, HSQ is used as the spin-on-glass material, and so tensile stress will be created after the deposited HSQ layer is baked, heat-flowed and cured. Hence, the material deposited over the metallic layer for forming a stress buffer must be a material capable of generating a compressive stress in order to cancel out the tensile stress in the HSQ layer. In FIG. 2A, MOS devices and silicon substrate 10 below a metallic layer 12 are not drawn. First, as shown in FIG. 2A, a thin stress buffer layer 14 is formed on and adjacent to the metallic layer 12 by depositing.

In this invention, a dielectric material capable of generating compressive stress, for example, oxide formed by an electron cyclotron resonance (ECR) process, is deposited over the silicon substrate 10 and the metallic layer 12 to form the stress buffer layer 14. The ECR oxide layer is formed using a supply of $SiH_4/O_2$ in a ratio of 8/85 sccm, a deposition pressure of about 3 mTorr, microwave power input of about 350 Watts and a reacting temperature ranging between 25° C. to 300° C.

Next, as shown in FIG. 2B, a spin-on-glass layer, for example, HSQ, is spincoated onto the wafer surface to form an inter-metal dielectric layer 16. The spin-on-glass layer is formed on and adjacent to the stress buffer layer 14. The steps of spin-coating HSQ onto the wafer surface include dissolving the HSQ in a solvent first. After mixing to form a solution of liquid state dielectric source material, the solution is spin-coated onto the wafer surface.

Thereafter, as shown in FIG. 2C, since the spin-coated HSQ dielectric layer 16 has solvent in it and the surface of the HSQ dielectric layer 16 is rather uneven, hence, heat flowing and curing operations need to be performed. First, a hot baking process is performed using, for example, a hot plate heated to a temperature of about 150° C. for about 8 to 12 minutes. In the process, most of the solvent inside the HSQ dielectric layer 16 is driven away and the formation of Si—O bonds is initiated.

Thereafter, the temperature is raised to about 200° C. for a period of about 18 to 22 minutes for melting the dielectric layer 16. Subsequently, the temperature is raised to about 350° C. for another 18 to 22 minutes to start the heat flow operation. Hence, the planarity of the HSQ dielectric layer 16 is increased and the effect of an undulating metallic layer 12 on the HSQ dielectric layer 16 is minimized. Finally, the temperature is raised to about 400° C. for about 18 to 22 minutes. At a high temperature, the residual solvent is driven away accompanied by densification of the HSQ dielectric layer 16, and finally the HSQ layer is cured into a $SiO_2$-like structure.

In this invention, an ECR oxide layer 14 is used as a stress buffer layer between the metallic layer and the HSQ dielectric layer 16. This is because ECR oxide is a silicon-rich and rigidly stacked oxide material. When an ECR oxide layer is deposited over a silicon or a metallic layer, for example, an ECR oxide layer having a thickness of about 200 nm over a silicon (100) wafer surface, the compressive stress produced is about –280 MPa. Therefore, when the ECR oxide layer is formed between a metallic layer and a HSQ dielectric layer, a portion of the tensile stress created within the HSQ layer will be cancelled.

Figure 3:
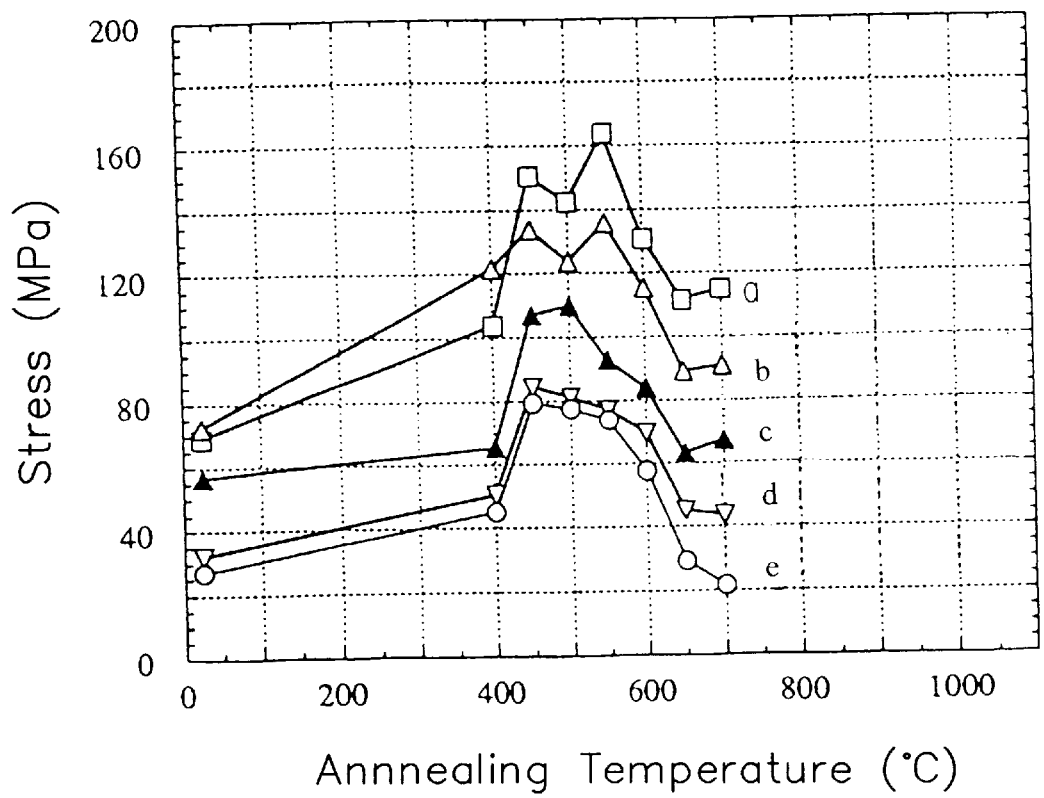
FIG. 3 is a graph showing variation of stress versus annealing temperature for a stress buffer that uses an ECR oxide layer having thickness ranging from a to e formed between a HSQ dielectric layer and the underlying silicon substrate and metallic layers according to one preferred embodiment of this invention.

FIG. 3 is a graph showing variation of stress versus annealing temperature for a stress buffer that uses an ECR oxide layer having various thickness formed between a HSQ dielectric layer and the underlying silicon substrate and metallic layers according to one preferred embodiment of this invention. As shown in FIG. 3, the curve labeled a represents no ECR oxide layer deposition, and b, c, d, and e represent ECR oxide layer thickness of 30 nm, 50 nm, 100 nm and 140 nm, respectively. From FIG. 3, the effects of having an ECR oxide layer acting as a stress buffer can be easily observed.

When the thickness of ECR oxide layer deposited is increased, the amount of tensile stress cancelled away is also increased. Hence, the overall stress in a HSQ layer is smaller. For example, after the curing of the HSQ layer, if no ECR oxide layer is formed, the tensile stress existing between the HSQ/Si interface can be as high as 80 MPa. Furthermore, when the layer is annealed in nitrogen at a high temperature of 400° C. to 700° C. for about an hour, the tensile stress becomes considerable.

However, if an ECR oxide stress buffer layer (thickness 50 nm to 140 nm) is added, the tensile stress is seen to reduce to a much lower level. Therefore, the ECR oxide layer is capable of preventing cracking of the HSQ dielectric layer. Furthermore, the ECR oxide layer not only can block incoming moisture, but also can produce good step coverage, both of which will benefit the metallization process.

In this embodiment, HSQ is used as an example of a spin-on-glass layer. However, for spin-on-glass layer that produces compressive stress instead of tensile stress after depositing on a substrate, a method according to this invention can also be used to lower the compressive stress. This time only that the materials for acting as the stress buffer layer must be capable of producing tensile stress instead of compressive stress.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A structure of reducing stress between a spin-on-glass layer and a metallic layer, comprising:

a stress buffer layer, wherein said stress buffer layer is formed on and adjacent to the metallic layer, and wherein said spin-on-glass layer is formed on and adjacent to the stress buffer layer; said stress buffer layer generating compressive stress.

2. The structure of claim 1, wherein the stress buffer layer includes a dielectric material formed by ECR process.

3. A The structure of claim 2, wherein the ECR oxide layer is formed under the conditions of supply of $SiH_4/O_2$ in the ratio of 8/85 sscm;

a deposition pressure of about 3 mTorr;

a microwave power input of about 350 Watts; and a reacting temperature in the range 25° C. to 300° C.

4. The structure of claim 1, wherein the spin-on-glass layer includes a spin-on-glass layer that can generate tensile stress.

5. The structure of claim 4, wherein the spin-on-glass layer includes a hydrogen silsesquioxane (HSQ) dielectric layer.

6. The structure of claim 5, wherein the HSQ dielectric layer is formed by the steps of:

driving away most of the solvent used in dissolving the HSQ material;

melting the HSQ material;

heating to make the HSQ material flow; and curing the HSQ material to form a HSQ dielectric layer.

7. The structure of claim 6, wherein the step of driving away most of the solvent includes heating the HSQ in a hot plate to a temperature of about 150° C. for about 8 to 12 minutes.

8. The structure of claim 6, wherein the step of melting the HSQ includes heating the HSQ in a hot plate to a temperature of about 200° C. for about 18 to 22 minutes.

9. The structure of claim 6, wherein the step of heating the HSQ to make it flow includes heating the HSQ in a hot plate to a temperature of about 350° C. for about 18 to 22 minutes.

10. The structure of claim 6, wherein the step of curing the HSQ includes heating the HSQ in a hot plate to a temperature of about 400° C. for about 18 to 22 minutes.

11. The structure of claim 1, wherein the stress buffer layer includes a deposited oxide layer.

12. The structure of claim 11, wherein the spin-on-glass layer includes a deposited spin-on-glass layer that can generate compressive stress.

* * * * *